(12) United States Patent
Chen et al.

(10) Patent No.: US 9,997,127 B2
(45) Date of Patent: Jun. 12, 2018

(54) DIGITAL-TO-ANALOG CONVERTER AND SOURCE DRIVING CIRCUIT

(71) Applicant: Sitronix Technology Corp., Hsinchu County (TW)

(72) Inventors: Yan-Gang Chen, Hsinchu County (TW); Chia-Chi Cheng, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 214 days.

(21) Appl. No.: 15/155,091

(22) Filed: May 16, 2016

(65) Prior Publication Data
US 2017/0063390 A1    Mar. 2, 2017

Related U.S. Application Data

(60) Provisional application No. 62/212,589, filed on Aug. 31, 2015.

(51) Int. Cl.
*G09G 3/36*       (2006.01)
*H03M 1/78*       (2006.01)
*H03M 1/76*       (2006.01)

(52) U.S. Cl.
CPC .......... *G09G 3/3688* (2013.01); *H03M 1/76* (2013.01); *H03M 1/78* (2013.01); *G09G 2300/0828* (2013.01); *G09G 2310/027* (2013.01); *G09G 2320/0673* (2013.01)

(58) Field of Classification Search
CPC .......... H03M 1/76–1/785; H03M 1/66; H03M 1/747; H03M 1/802; H03M 1/804; H03M 1/806; G09G 3/3685; G09G 3/3688; G09G 2310/027
See application file for complete search history.

(56) References Cited

U.S. PATENT DOCUMENTS

| | | | |
|---|---|---|---|
| 5,999,115 A | 12/1999 | Connell | |
| 7,423,572 B2 * | 9/2008 | Nakayama | H03M 1/76 341/145 |
| 7,671,775 B2 * | 3/2010 | Doi | G09G 3/3688 341/145 |
| 7,859,445 B1 * | 12/2010 | Lee | H03M 1/76 341/144 |
| 8,188,899 B2 | 5/2012 | Motamed | |
| 2007/0176813 A1 * | 8/2007 | Nakayama | H03M 1/76 341/144 |
| 2009/0096819 A1 * | 4/2009 | Kinoshita | G09G 3/3685 345/694 |
| 2009/0184856 A1 * | 7/2009 | Doi | G09G 3/3688 341/154 |

(Continued)

FOREIGN PATENT DOCUMENTS

TW      200824302      6/2008

*Primary Examiner* — Patrick F Marinelli
(74) *Attorney, Agent, or Firm* — Winston Hsu

(57) ABSTRACT

A digital-to-analog converter includes a first input end for reversely receiving a digital signal, a second input end for receiving multiple reference voltages arranged in a best order, wherein the best order is determined by reordering an initial order several times, multiple first switches coupled to each other stage by stage like a tree for selecting one of the reference voltages to be a first selection result, multiple second switches coupled in series for selecting one of the reference voltages to be a second selection result.

17 Claims, 11 Drawing Sheets

(56) References Cited

U.S. PATENT DOCUMENTS

| | | | |
|---|---|---|---|
| 2010/0328126 A1* | 12/2010 | Lee | H03M 1/76 341/144 |
| 2013/0113640 A1* | 5/2013 | Chuang | H03M 1/68 341/136 |
| 2014/0002433 A1* | 1/2014 | Knausz | H03M 1/661 345/211 |
| 2014/0132494 A1* | 5/2014 | Kudo | G09G 3/3607 345/89 |
| 2016/0241255 A1* | 8/2016 | Takahashi | H03M 1/68 |
| 2017/0063390 A1* | 3/2017 | Chen | H03M 1/76 |

* cited by examiner

SEQ0= {Vr0, Vr1, Vr2, Vr3, Vr4, Vr5, Vr6, Vr7, Vr8, Vr9, Vr10, Vr11, Vr12, Vr13, Vr14, Vr15}

SEQ1= {Vr0, Vr2, Vr4, Vr6, Vr8, Vr10, Vr12, Vr14, Vr1, Vr3, Vr5, Vr7, Vr9, Vr11, Vr13, Vr15}
$\underbrace{\hspace{3cm}}_{\text{seq 11}}$ $\underbrace{\hspace{3cm}}_{\text{seq 12}}$ SEQ2= {Vr0, Vr4, Vr8, Vr12, Vr2, Vr6, Vr10, Vr14, Vr1, Vr5, Vr9, Vr13, Vr3, Vr7, Vr11, Vr15}
$\underbrace{\hspace{1.5cm}}_{\text{seq 21}}$ $\underbrace{\hspace{1.5cm}}_{\text{seq 22}}$ $\underbrace{\hspace{1.5cm}}_{\text{seq 23}}$ $\underbrace{\hspace{1.5cm}}_{\text{seq 24}}$ SEQ3= {Vr0, Vr8, Vr4, Vr12, Vr2, Vr10, Vr6, Vr14, Vr1, Vr9, Vr5, Vr13, Vr3, Vr11, Vr7, Vr15}

FIG. 5

DIGITAL-TO-ANALOG CONVERTER AND SOURCE DRIVING CIRCUIT

CROSS REFERENCE TO RELATED APPLICATIONS

This application claims the benefit of U.S. Provisional Application No. 62/212,589 filed on Aug. 31, 2015, the contents of which are incorporated herein.

BACKGROUND OF THE INVENTION

1. Field of the Invention

The present invention relates to a digital-to-analog converter and source driving circuit, and more particularly to a digital-to-analog converter and source driving circuit requiring fewer switches by reordering reference voltages.

2. Description of the Prior Art

A liquid crystal display (LCD) monitor has characteristics of light weight, low power consumption, zero radiation, etc. and is widely used in many information technology (IT) products, such as televisions, mobile phones, and laptop computers. The operating principle of the LCD monitor is based on the fact that different twist states of liquid crystals result in different polarization and refraction effects on light passing through the liquid crystals. Thus, the liquid crystals can be used to control amount of light emitted from the LCD monitor by arranging the liquid crystals in different twist states, so as to produce light outputs at various brightnesses.

Please refer to FIG. 1, which is a schematic diagram of a thin film transistor (TFT) LCD monitor 10 of the prior art. The LCD monitor 10 includes an LCD panel 100, a source driver 102, a gate driver 104 and a voltage generator 106. The LCD panel 100 is composed of two substrates, and space between the substrates is filled with liquid crystal materials. One of the substrates is installed with a plurality of data lines 108, a plurality of scan lines (or gate lines) 110 and a plurality of TFTs 112, and another substrate is installed with a common electrode for providing a common signal Vcom outputted by the voltage generator 106. The TFTs 112 are arranged as a matrix on the LCD panel 100. Accordingly, each data line 108 corresponds to a column of the LCD panel 100, each scan line 110 corresponds to a row of the LCD panel 100, and each TFT 112 corresponds to a pixel. Note that the LCD panel 100 composed of the two substrates can be regarded as an equivalent capacitor 114.

The source driver 102 and the gate driver 104 input signals to the corresponding data lines 108 and scan lines 110 based upon a desired image data, to control whether or not to enable the TFT 112 and a voltage difference between two ends of the equivalent capacitor 114, so as to change alignment of the liquid crystals as well as the penetration amount of light. As a result, the desired image data can be correctly displayed on the LCD panel 100. In order to display various gray levels, the source driver 102 has to provide hundreds of voltage levels to the LCD panel 100. For example, to display 256 gray levels, the source driver 102 has to select one reference voltage from 256 reference voltages according to an 8-bit digital signal to be a source driving signal. However, implementation for the 256-level selection requires a large number of transistor switches, which occupy a large circuit layout area and cause parasitic resistors, which is a heavy burden on display driving efficiency.

SUMMARY OF THE INVENTION

It is therefore a primary objective of the claimed invention to provide a digital-to-analog converter and source driving circuit, which require smaller circuit layout area and cause less parasitic resistance.

The present invention discloses a digital-to-analog converter for converting a digital signal into a first analog signal and a second analog signal, the digital signal comprising N bits, N being a positive integer, the digital-to-analog converter comprising a plurality of first input ends, each for receiving one of the N bits; a plurality second input ends, for receiving a plurality of reference voltages arranged in a best order, wherein the plurality of reference voltages ordered by magnitude determines an original order, wherein the original order is performed with (N−1) reorder processes to determine the best order; a plurality of first switches, electrically coupled to each other in a tree structure and electrically coupled to the plurality first input ends and the plurality second input ends, comprising N stages, each for selecting one of the plurality reference voltages according to one of the N bits to generate a first selection result; at least N second switches, coupled in series, each for selecting a second selection result of a previous second switch of the second switch or the first selection result of one of the plurality of first switches according to one of the N bits, to generate the second selection result; wherein the first selection result generated by the first switch of the Nth stage is the first analog signal, and the second selection result generated by the last one of the at least N second switches is the second analog signal; wherein the Nth second switch is utilized for receiving the first selection result generated by the second first switch of the (N−1)th stage.

The present invention further discloses a digital-to-analog converter for converting a digital signal into a first analog signal and a second analog signal, the digital signal comprising N bits, N being a positive integer, the digital-to-analog converter comprising a plurality of first input ends, each for receiving one of the N bits; a plurality second input ends, for receiving a plurality of reference voltages arranged in a second best order, wherein the plurality of reference voltages ordered by magnitude determines an original order, wherein the original order is performed with (N−2) reorder processes to determine the second best order; a plurality of first switches, electrically coupled to each other in a tree structure and electrically coupled to the plurality first input ends and the plurality second input ends, comprising N stages, each for selecting one of the plurality reference voltages according to one of the N bits to generate a first selection result; at least (N+1) second switches, coupled in series, each for selecting a second selection result of a previous second switch of the second switch or the first selection result of one of the plurality of first switches according to one of the N bits, to generate the second selection result; wherein the first selection result generated by the first switch of the Nth stage is the first analog signal, and the second selection result generated by the last one of the at least (N+1) second switches is the second analog signal; wherein the Nth second switch is utilized for receiving the first selection result generated by the second first switch of the (N−1)th stage.

The present invention further discloses a source driving circuit, comprising a Gamma circuit, for providing a plurality of reference voltages between a high voltage and a low voltage; a digital-to-analog converter, electrically coupled to the Gamma circuit, for selecting two from the plurality of reference voltages according to a digital signal comprising N bits to be a first analog signal and a second analog signal; and an interpolation circuit, electrically coupled to the digital-to-analog converter, for providing an interpolation voltage of the first analog signal and second analog signal according to a second digital signal to be a source driving signal; wherein the digital-to-analog converter comprises a plurality of first input ends, each for receiving one of the N bits; a plurality second input ends, for receiving the plurality of reference voltages arranged in a best order, wherein the plurality of reference voltages ordered by magnitude determines an original order, wherein the original order is performed with (N−1) reorder processes to determine the best order; a plurality of first switches, electrically coupled to each other in a tree structure and electrically coupled to the plurality first input ends and the plurality second input ends, comprising N stages, each for selecting one of the plurality reference voltages according to one of the N bits to generate a first selection result; at least N second switches, coupled in series, each for selecting a second selection result of a previous second switch of the second switch or the first selection result of one of the plurality of first switches according to one of the N bits, to generate the second selection result; wherein the first selection result generated by the first switch of the Nth stage is the first analog signal, and the second selection result generated by the last one of the at least N second switches is the second analog signal; wherein the Nth second switch is utilized for receiving the first selection result generated by the second first switch of the (N−1)th stage.

The present invention further discloses a source driving circuit, comprising a Gamma circuit, for providing a plurality of reference voltages between a high voltage and a low voltage; a digital-to-analog converter, electrically coupled to the Gamma circuit, for selecting two from the plurality of reference voltages according to a digital signal comprising N bits to be a first analog signal and a second analog signal; and an interpolation circuit, electrically coupled to the digital-to-analog converter, for providing an interpolation voltage of the first analog signal and second analog signal according to a second digital signal to be a source driving signal; wherein the digital-to-analog converter comprises a plurality of first input ends, each for receiving one of the N bits; a plurality second input ends, for receiving the plurality of reference voltages arranged in a second best order, wherein the plurality of reference voltages ordered by magnitude determines an original order, wherein the original order is performed with (N−2) reorder processes to determine the second best order; a plurality of first switches, electrically coupled to each other in a tree structure and electrically coupled to the plurality first input ends and the plurality second input ends, comprising N stages, each for selecting one of the plurality reference voltages according to one of the N bits to generate a first selection result; at least (N+1) second switches, coupled in series, each for selecting a second selection result of a previous second switch of the second switch or the first selection result of one of the plurality of first switches according to one of the N bits, to generate the second selection result; wherein the first selection result generated by the first switch of the Nth stage is the first analog signal, and the second selection result generated by the last one of the at least (N+1) second switches is the second analog signal; wherein the Nth second switch is utilized for receiving the first selection result generated by the second first switch of the (N−1)th stage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a schematic diagram of a reorder process according to an embodiment of the present invention.

DETAILED DESCRIPTION

Figure 1:
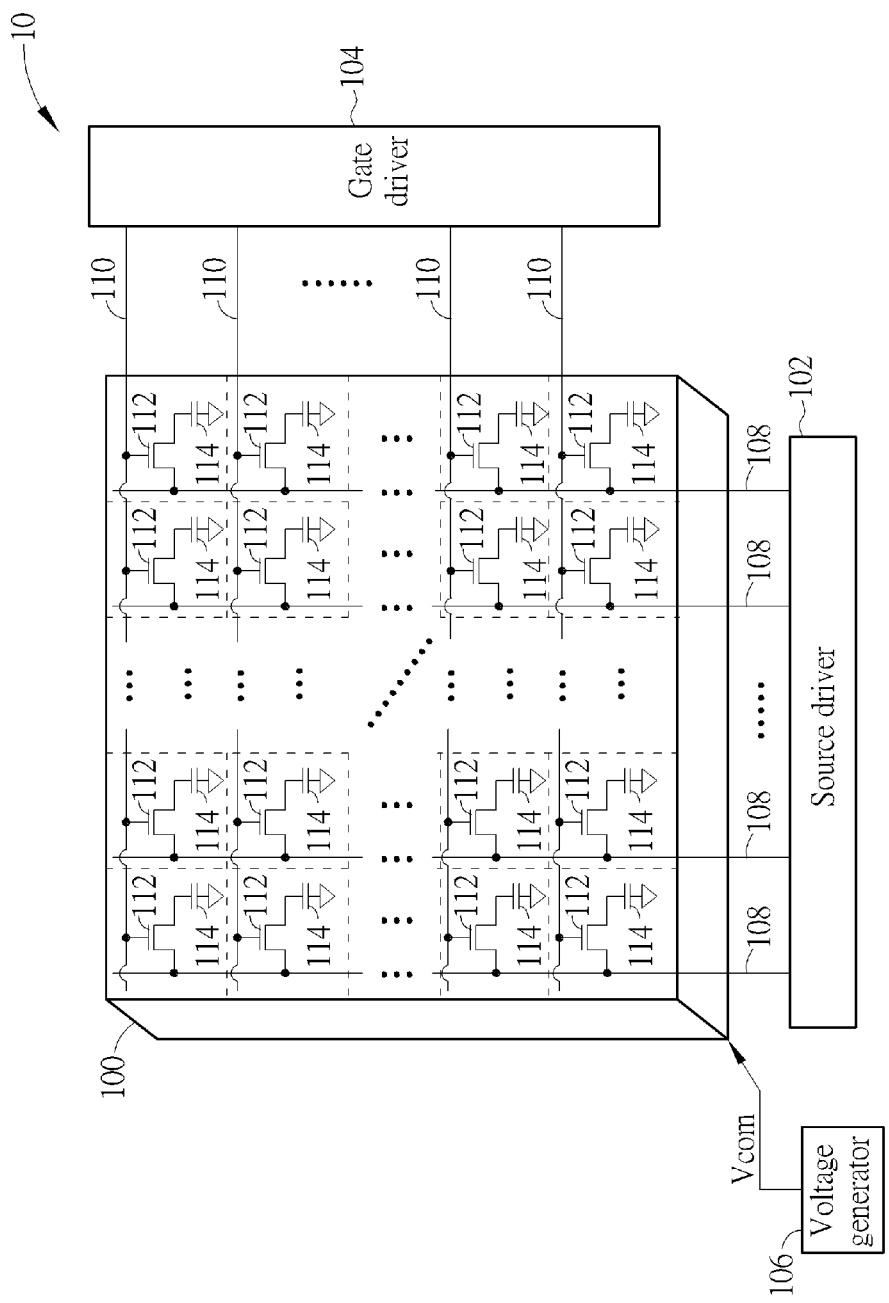
FIG. 1 is a schematic diagram of a thin film transistor LCD monitor of the prior art.
Figure 2A:
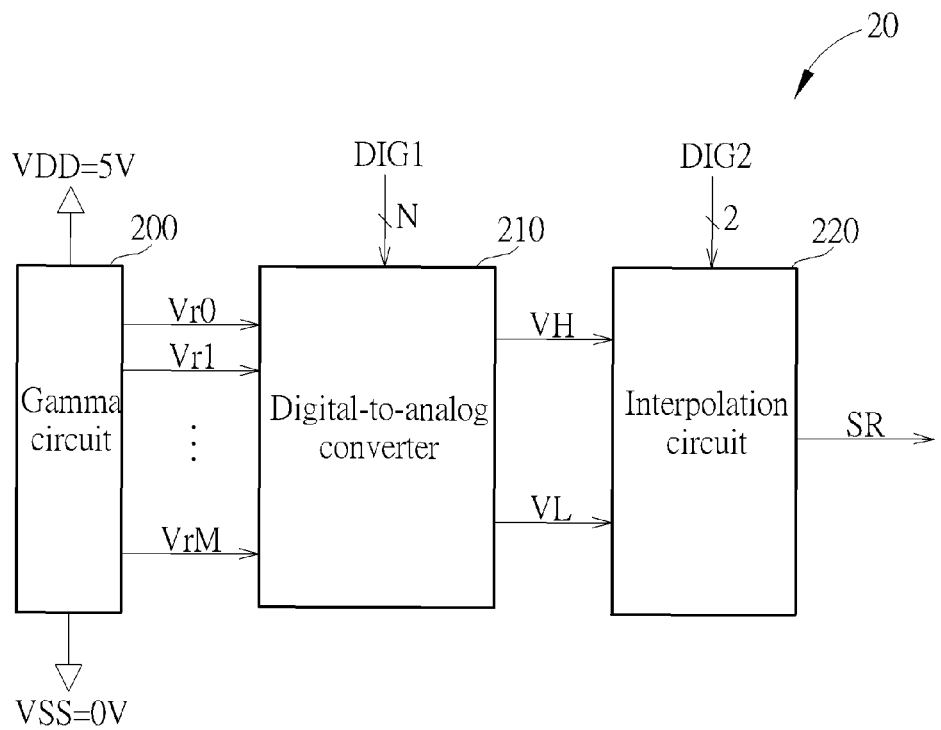
FIG. 2A is a schematic diagram of a source driving circuit.
Figure 2B:
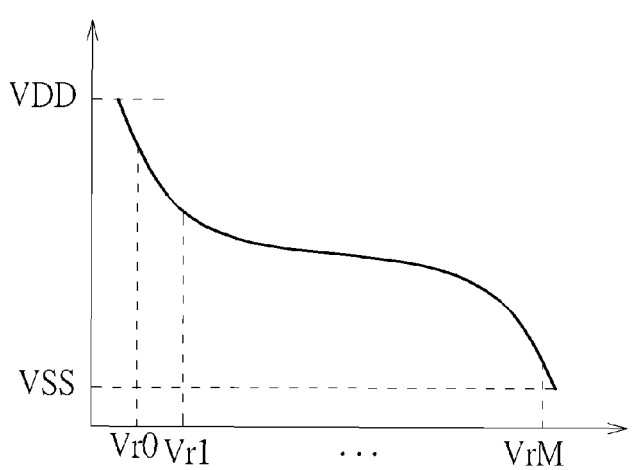
FIG. 2B is a schematic diagram of reference voltages of the source driving circuit of FIG. 2A.
Figure 2C:
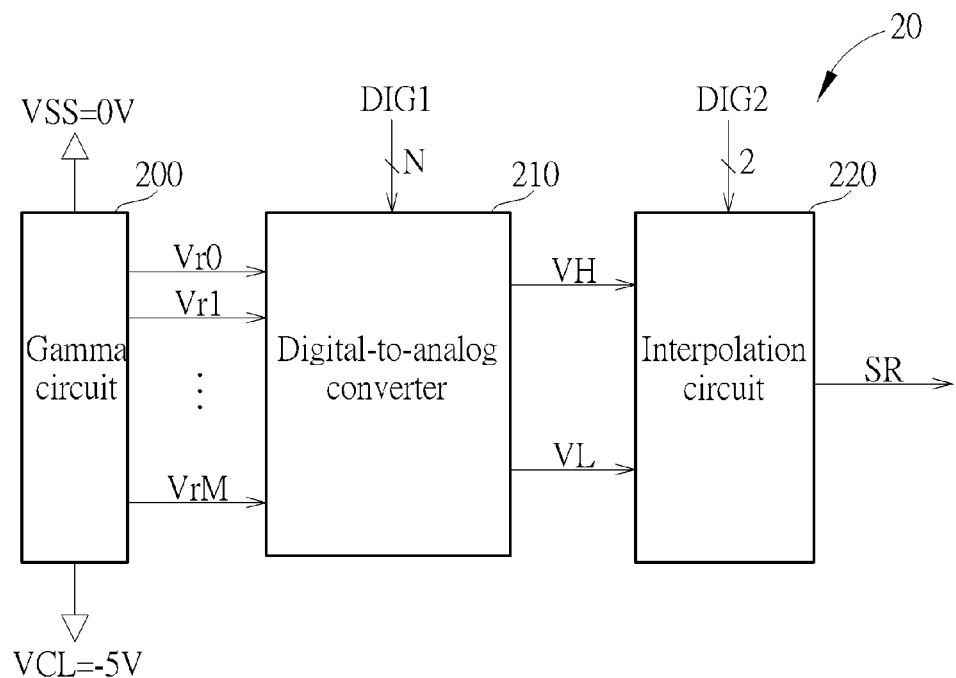
FIG. 2C is a schematic diagram of an alternative embodiment of the source driving circuit of FIG. 2A.
Figure 2D:
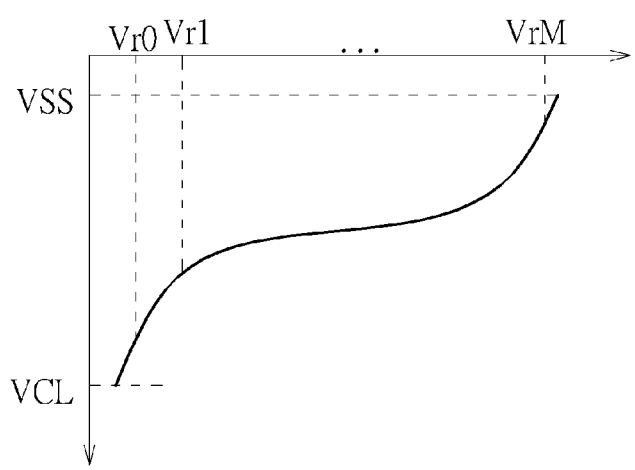
FIG. 2D is a schematic diagram of reference voltages of the source driving circuit of FIG. 2C.

Please refer to FIG. 2A, which is a schematic diagram of a source driving circuit 20. The source driving circuit 20 includes a Gamma circuit 200, a digital-to-analog converter 210 and an interpolation circuit 220. The Gamma circuit 200 is utilized for providing M+1 reference voltages Vr0, Vr1, . . . , VrM between a high voltage VDD and a low voltage VSS, e.g. 5V=VDD>=Vr0>Vr1> . . . >VrM>=VSS=0V, which are candidates for a source driving voltage. Based upon chromatic needs, the reference voltages Vr0, Vr1, . . . , VrM are arranged to depict a non-linear curve, as illustrated in FIG. 2B. According to an alternative embodiment, the reference voltages Vr0, Vr1 . . . VrM could be negative, i.e. 0V=VSS>=VrM> . . . >Vr1>Vr0>=VCL=−5V, where VCL denotes another low voltage, as illustrated in FIG. 2C. In such an arrangement, the reference voltages Vr0, Vr1, . . . , VrM depict another non-linear curve shown in FIG. 2D. The Gamma circuit 200 could be implemented by resistors connected in series. The digital-to-analog converter 210 is utilized for selecting two reference voltages from the reference voltages Vr0, Vr1, . . . , VrM according to an N-bit digital signal DIG1 to be a first analog signal VH and a second analog signal VL. The interpolation circuit 220 is utilized for providing an interpolation voltage of the first analog signal VH and the second analog signal VL according to a 2-bit second digital signal DIG2 to be a source driving signal SR.

Figure 3A:
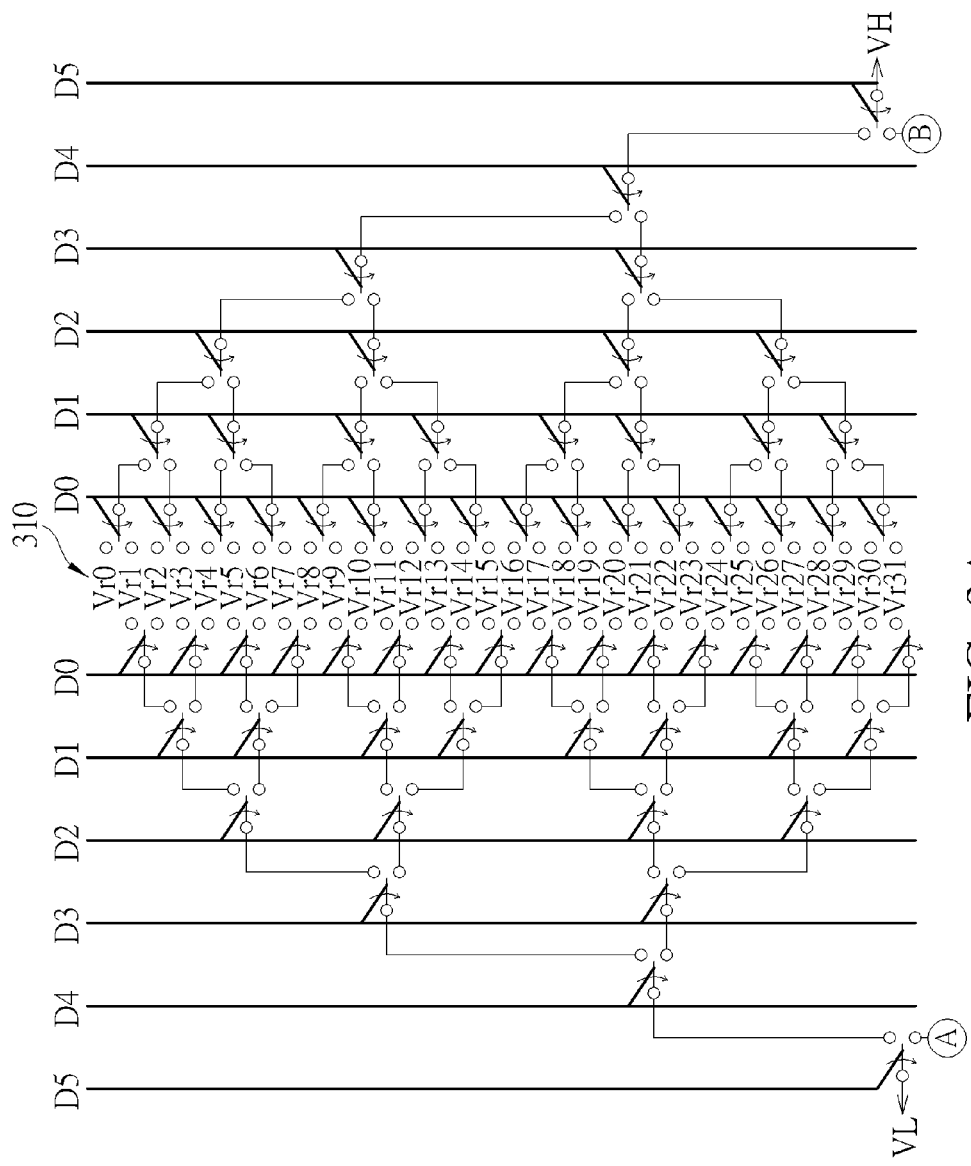
FIG. 3A and FIG. 3B are schematic diagrams of a digital-to-analog converter.
Figure 3B:
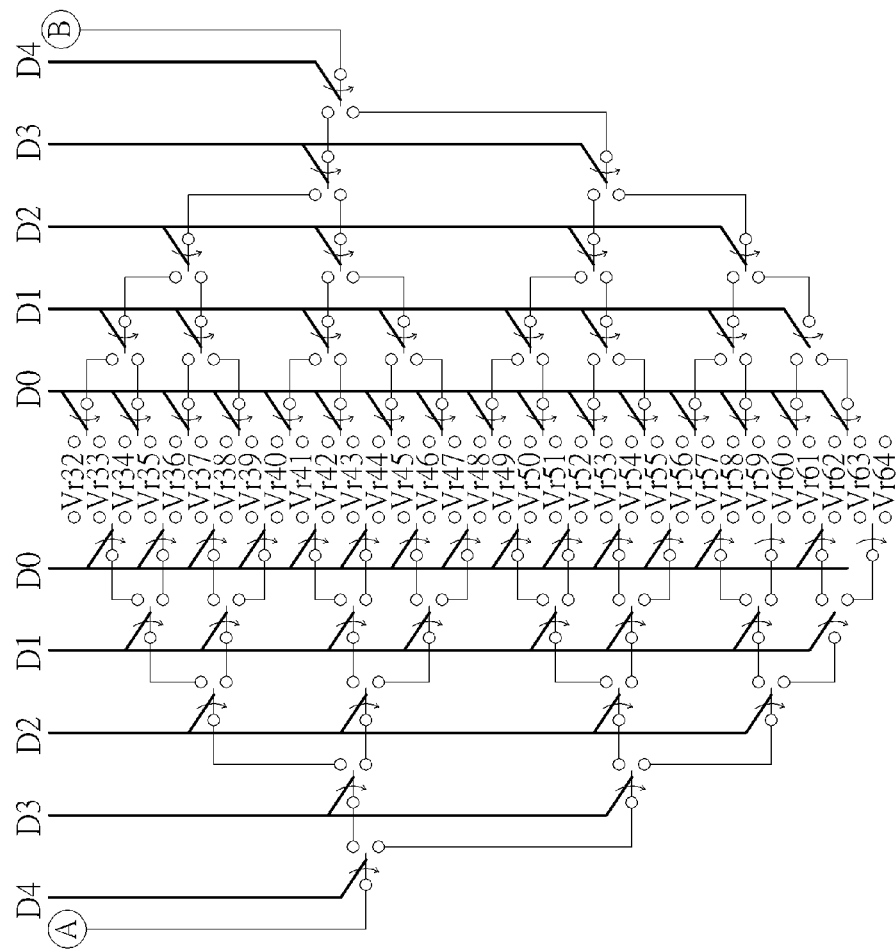

Note that, the first analog signal VH and the second analog signal VL are two adjacent reference voltages. For example, if the source driving circuit 20 can provide $2^8$ candidate voltages to be the source driving signal SR, the digital-to analog converter 210 would be a 6-bit digital-to-analog converter 310 as illustrated in FIG. 3A and FIG. 3B. In FIG. 3A and FIG. 3B, there are 65 reference voltages (M=64), and the digital signal DIG1 includes six bits D0, D1, D2, D3, D4, D5. The digital-to-analog converter 310 selects two adjacent reference voltages from the reference voltage Vr0, Vr1, . . . , Vr64 according to the bits D0, D1, D2, D3, D4, D5 to be the first analog signal VH and the second analog signal VL. Further, the interpolation circuit 220 inserts four voltages between the first analog signal VH and the second analog signal VL and selects one from the four voltages according to the 2-bit second digital signal DIG2 to be the source driving signal SR. As a result, the source driving circuit 20 can generates $2^6*2^2=2^8$ possible voltage levels for the source driving signal SR. Note that, the digital-to-analog converter 310 requires 126 switches. If each of the 126 switches is implemented by two transistors, 252 transistors are totally required. Therefore, the present invention further provides another digital-to-analog converter, which requires fewer transistors than the digital-to-analog converter 310. Please refer to FIG. 4A and FIG. 4B, which is a schematic diagram of an N-bit (N=6) digital-to-analog converter 410 according to an embodiment of the present invention. The digital-to-analog converter 410 is utilized for converting a digital signal DIG1 into a first analog signal VH and a second analog signal VL. The digital signal DIG1 includes N bits D0, D1 . . . DN−1, where N denotes a positive integer. The digital-to-analog converter 410 includes multiple first input ends 412, multiple second input ends 414, multiple first switches 416 and at least N second switches 418. The first input ends 412 are respectively utilized for receiving the bits DN−1, DN−2 . . . D1, D0 (contrary to the receiving order of the digital-to-analog converter 310). The second input ends 414 are respectively utilized for receiving multiple reference voltages Vr0–Vr$2^N$ arranged in a best order shown in FIG. 4A and FIG. 4B. In order to narrate the present invention more easily, the reference voltages Vr0–Vr$2^N$ ordered by magnitude (Vr0>Vr1> . . . >Vr$2^N$) determines an original order (Vr0→Vr1→ . . . →Vr$2^N$), and the original order is performed with (N−1) reorder processes to determine the best order (Vr0→Vr32→Vr16→ . . . →Vr$2^N$). The first switches 416 are electrically coupled to each other in a tree structure, and include N stages, each for selecting one of the reference voltages Vr0–Vr$2^N$ according to one of the N bits to generate a first selection result. Each of the second switches 418_1-418_6 is utilized for selecting a second selection result of a previous second switch (418_1-418_5) of the second switch or the first selection result of the corresponding first switch according to one of the N bits DN−1, D1, D0, to generate the second selection result. For N>=2, the Nth second switch 418_N is utilized for receiving the first selection result generated by the second first switch of the (N−1)th stage. Finally, through the switching operations of N stages, the first selection result generated by the first switch 416 of the Nth stage is the first analog signal VH, and the second selection result generated by the last second switch 418_6 is the second analog signal VL. Note that, the N stages of the first switches 416 correspond to the N bits D0, D1, . . . , DN−1 according to a reverse order, which means that the first switches 416 of the first stage are controlled by the bit DN−1, the first switches 416 of the second stage are controlled by the bit and the first switch 416 of the Nth stage is controlled by the bit D0. Similarly, Similarly, the second switches 418 also correspond to the N bits D0, D1, . . . , DN−1 according to the reverse order, which means that the first second switch 418_1 is controlled by the bit DN−1, the second second switch 418_2 is controlled by the bit DN−2, . . . , and the Nth second switch 418_N is controlled by the bit D0. In comparison with the digital-to-analog converter 310 requiring 252 transistors, the digital-to-analog converter 410 of FIG. 4A and FIG. 4B merely requires 138 transistors, but can generate the same first analog signal VH and the second analog signal VL. Therefore, the digital-to-analog converter 410 requires less circuit layout area and causes less parasitic capacitance than the digital-to-analog converter 310. In other words, the digital-to-analog converter 410 arranges the input order of the reference voltages Vr0–Vr$2^N$, such that the second switches 418 can use a part of the first selection result of the first switches 416, so as to reduce the number of the second switches 418.

How the reference voltages Vr0–Vr$2^N$ are reordered is illustrated in FIG. 5, in which the reference voltages Vr0–Vr15 are reordered for example. In the embodiment of FIG. 5, N=4, and the reference voltages Vr0–Vr15 are performed with N−1=3 reorder processes. During the first reorder process, odd components {Vr0, Vr2, Vr4 . . . Vr14} of an original sequence SEQ0={Vr0–Vr15} are acquired to form a first half part of a new first sequence, and even components {Vr1, Vr3, Vr5 . . . Vr15} of the original sequence SEQ0 are acquired to form a second half part of the first sequence, i.e. SEQ1={Vr0, Vr2, Vr4, Vr6, Vr8, Vr10, Vr12, Vr14, Vr1, Vr3, Vr5, Vr7, Vr9, Vr11, Vr13, Vr15}. During the second reorder process:

(1) the first sequence is divided into two sub-sequences seq11={Vr0, Vr2, Vr4, Vr6, Vr8, Vr10, Vr12, Vr14} and seq12={Vr1, Vr3, Vr5, Vr7, Vr9, Vr11, Vr13, Vr15};
(2) odd components {Vr0, Vr4, Vr8, Vr12} of the first sub-sequence seq11 of the sub-sequences seq11, seq12 are acquired to form a $1/2^2$ part of a second sequence SEQ2;
(3) even components {Vr2, Vr6, Vr10, Vr14} of the first sub-sequence seq11 of the sub-sequences seq11, seq12 are acquired to form a $2/2^2$ part of the second sequence SEQ2;
(4) odd components {Vr1, Vr5, Vr9, Vr13} of the second sub-sequence seq12 of the sub-sequences seq11, seq12 are acquired to form a $3/2^2$ part of the second sequence SEQ2; and
(5) even components {Vr3, Vr7, Vr11, Vr15} of the second sub-sequence seq12 of the sub-sequences seq11, seq12 are acquired to form a $4/2^2$ part of the second sequence SEQ2.

Therefore, the whole second sequence SEQ2 is {Vr0, Vr4, Vr8, Vr12, Vr2, Vr6, Vr10, Vr14, Vr1, Vr5, Vr9, Vr13, Vr3, Vr7, Vr11, Vr15}. Similarly, during the third reorder process:

(1) the second sequence is divided into $2^2$ sub-sequences seq21={Vr0, Vr4, Vr8, Vr12}, seq22={Vr2, Vr6, Vr10, Vr14}, seq23={Vr1, Vr5, Vr9, Vr13} and seq24={Vr3, Vr7, Vr11, Vr15};
(2) odd components of the sub-sequences seq21, seq22, seq23, seq24 are respectively acquired to form $1/2^3$, $3/2^3$, $5/2^3$, $7/2^3$ parts of a third sequence SEQ3; and
(3) even components of the sub-sequences seq21, seq22, seq23, seq24 are respectively acquired to form $2/2^3$, $4/2^3$, $6/2^3$, $8/2^3$ parts of the third sequence SEQ3.

As a result, the whole third sequence SEQ3 is {Vr0, Vr8, Vr4, Vr12, Vr2, Vr10, Vr6, Vr14, Vr1, Vr9, Vr5, Vr13, Vr3, Vr11, Vr7, Vr15}.

The above first to third reorder processes can be summarized into a general rule, so as to derive the (N−1)th reorder process, which includes the following steps:
(1) dividing an (N−2)th sequence into $2^{N-2}$ sub-sequences seq(N−2)1–seq(N−2)$2^{N-2}$;
(2) acquiring odd components of K (K=1–$2^{N-2}$) sub-sequences seq(N−2)1–seq(N−2)$2^{N-2}$ to form a $(2K-1)/2^{N-1}$ part of an (N−1)th sequence; and (3) acquiring even components of K (K=1-$2^{N-2}$) sub-sequences seq(N−2)1−seq(N−2)$2^{N-2}$ to form a 2K/$2^{N-1}$ part of the (N−1)th sequence.

Figure 4A:
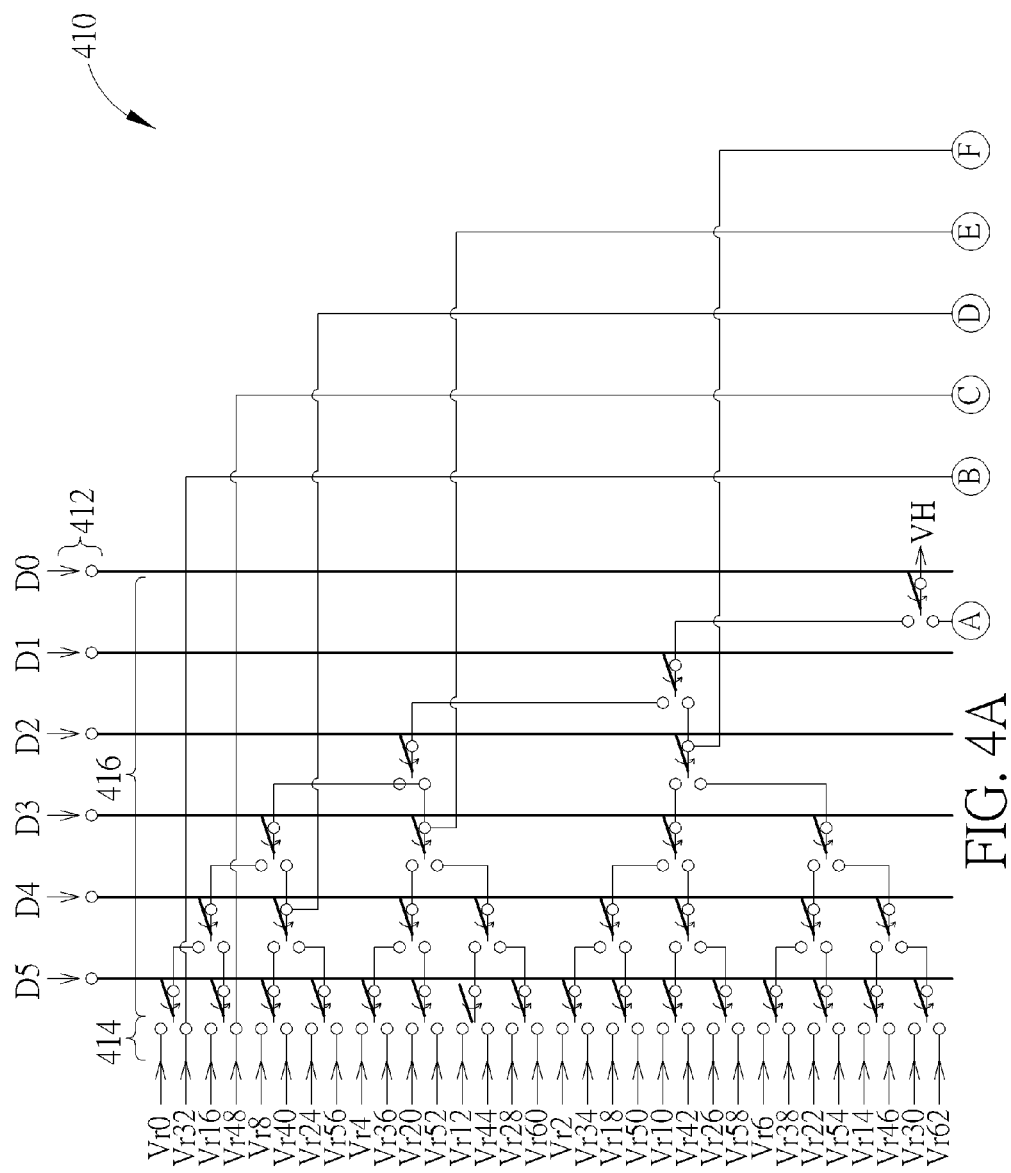
FIG. 4A and FIG. 4B are schematic diagrams of a digital-to-analog converter according to an embodiment of the present invention.
Figure 4B:
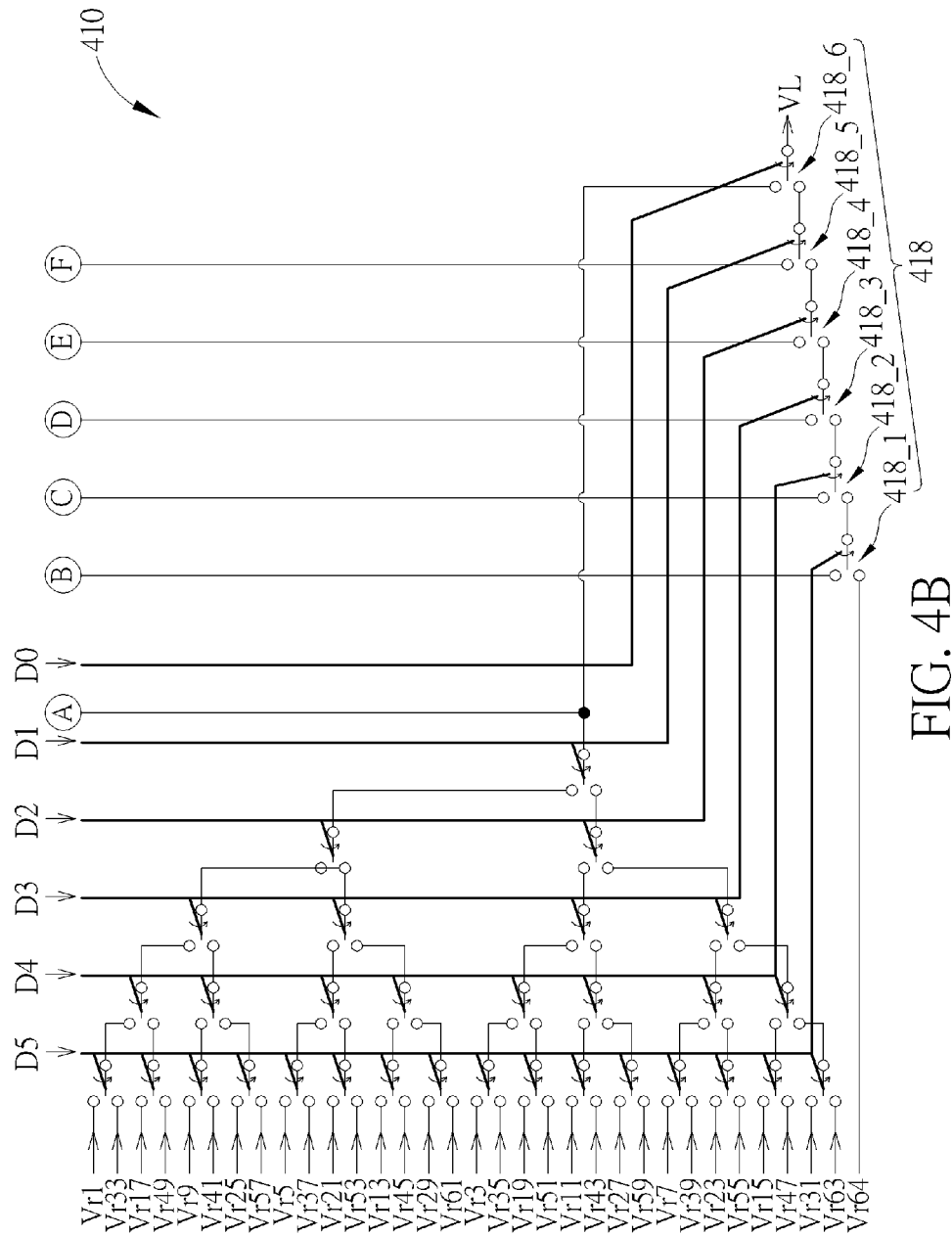

For example, the order of the reference voltages of FIG. 4A and FIG. 4B is the result of N-1=5 reorder processes. Details of the five reorder processes can be acquired by setting K=N−1=1, 2, 3, 4 or 5 in the above steps.

Note that, the digital signal DIG1 has to be received according to the reverse order in the digital-to-analog converter 410, such that the first analog signal VH and the second analog signal VL of the digital-to-analog converter 410 can be the same as the first analog signal VH and the second analog signal VL of the digital-to-analog converter 310. Particularly, the reverse order is defined herein to be a reversed bit order of the digital signal DIG1. For example, according to the embodiment of FIG. 4A and FIG. 4B, the original bit order is {D0, D1, D2, D3, D4, D5}, and the reverse order is {D5, D4, D3, D2, D1, D0}.

In addition, a special case is that there is no previous second switch for the first second switch 418_1 according to FIG. 4A and FIG. 4B. In such a case, the first second switch 418_1 selects the ($2^{(N-1)}$+1=33)th reference voltage Vr32 numbered by the original order or the ($2^N$+1=65)th reference voltage Vr64 numbered by the original order according to the (N=6)th bit D5.

According to an embodiment, the first switches 416 and the second switches 418 could be implemented by transistor switches.

Figure 6A:
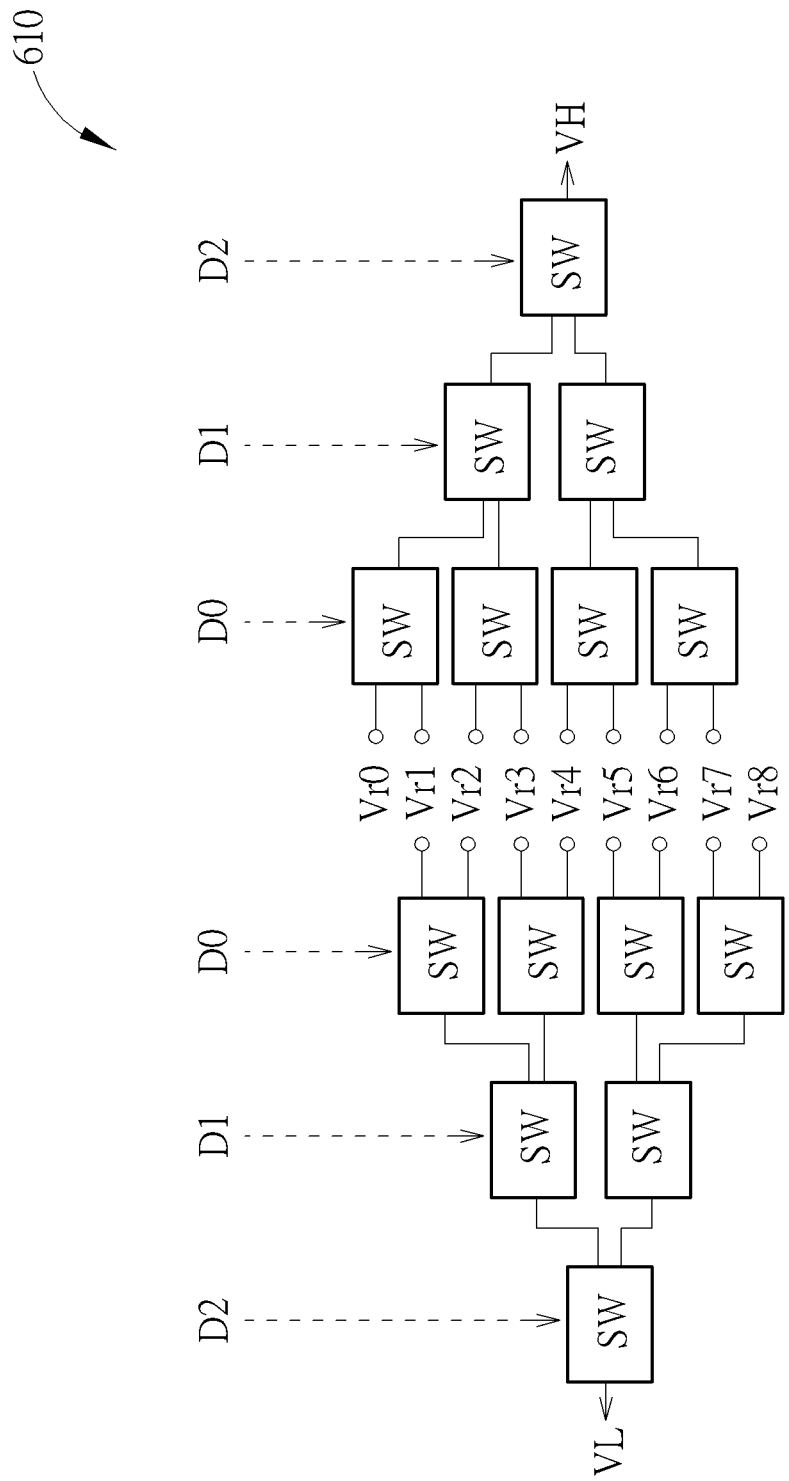
FIG. 6A is a schematic diagram of a digital-to-analog converter.
Figure 6B:
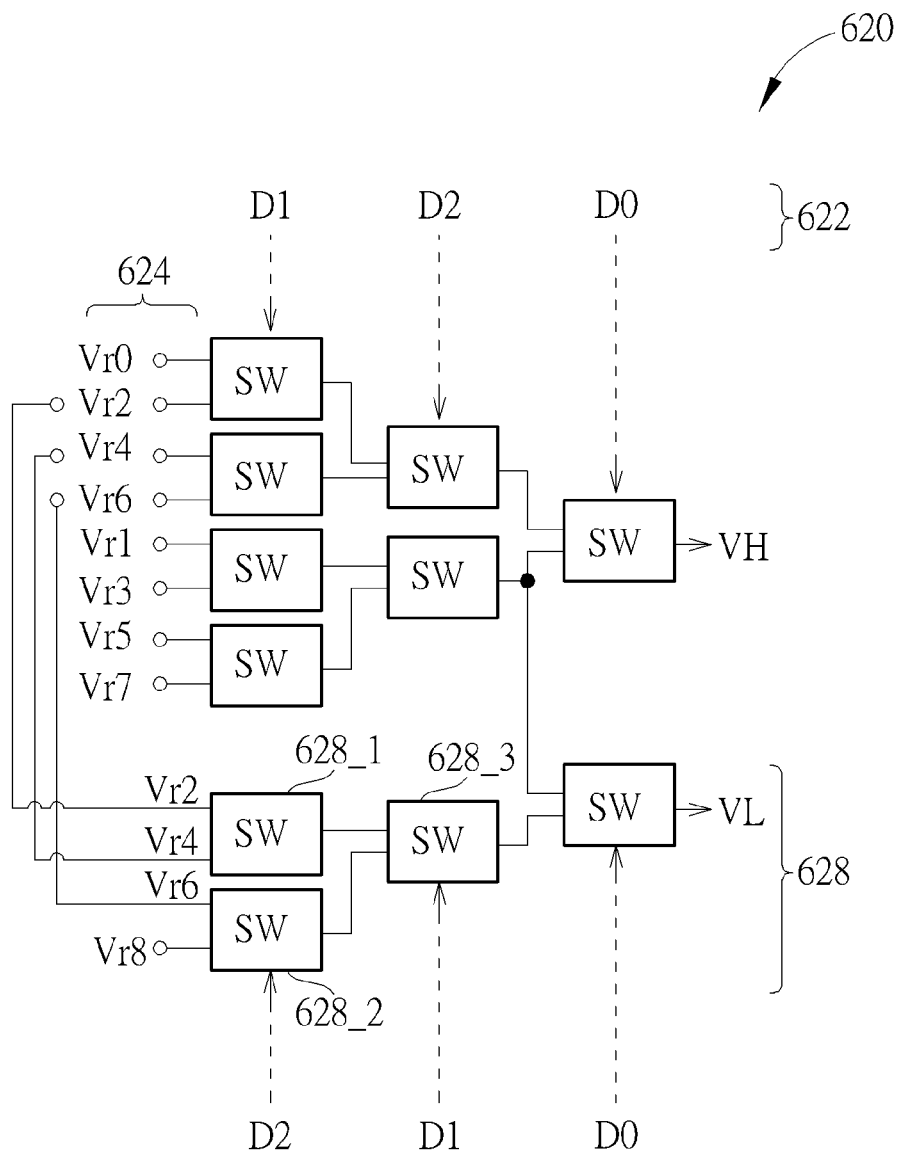
FIG. 6B is a schematic diagram of a digital-to-analog converter according to an embodiment of the present invention.
Figure 6C:
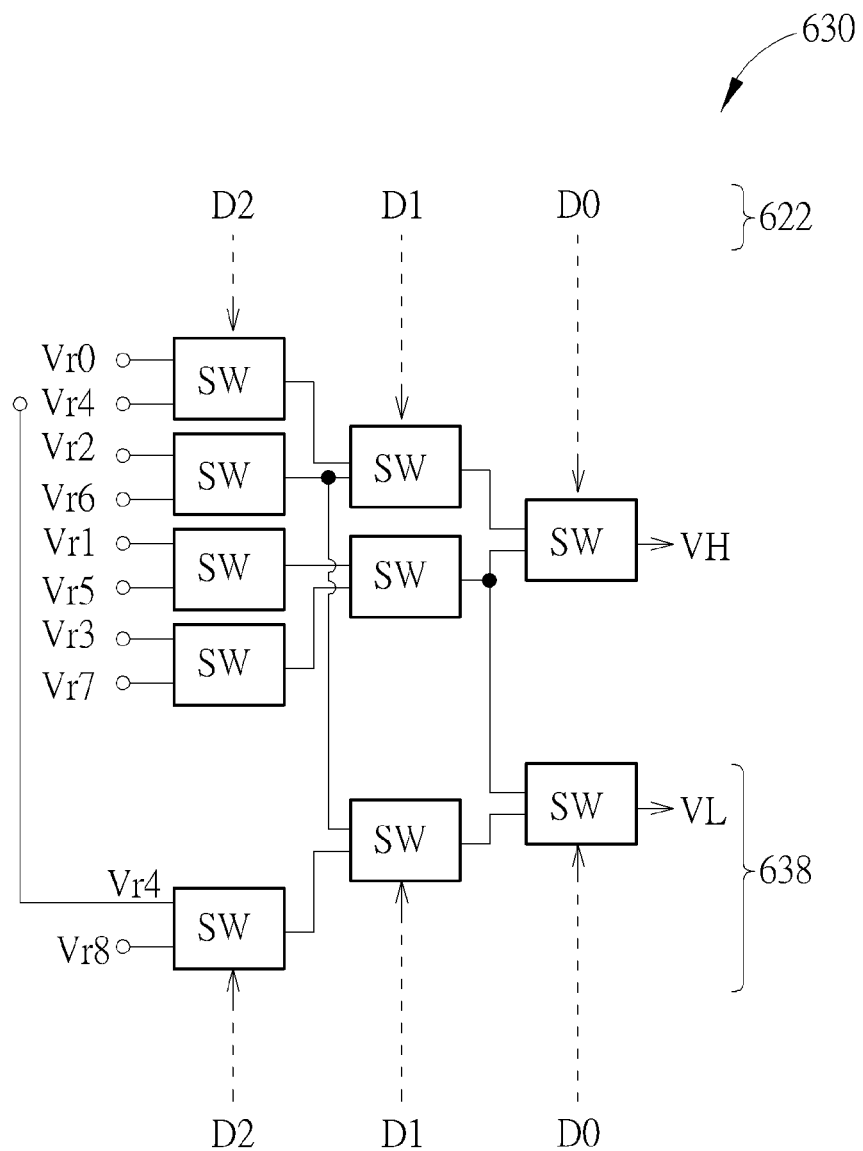
FIG. 6C is a schematic diagram of a digital-to-analog converter according to an embodiment of the present invention.

Notably, although N−1=5 reorder processes are performed according to the embodiment of FIG. 4A and FIG. 4B, a second best order can be formed for the reference voltages Vr0, Vr1 . . . VrM if only N−2 reorder processes are performed. For example, if N=3, and the reference voltages Vr0-Vr8 are received according to the original order, a 3-bit digital-to-analog converter 610 requires 28 transistors, as illustrated in FIG. 6A. If the reference voltages Vr0-Vr8 are performed with N−2=1 reorder process, and are received according to the second best order, a 3-bit digital-to-analog converter 620 requires 22 transistors, as illustrated in FIG. 6B. If the reference voltages Vr0-Vr8 are performed with N−1=2 reorder processes, and are received according to the best order, a 3-bit digital-to-analog converter 630 requires 20 transistors, as illustrated in FIG. 6C. Therefore, receiving the reference voltages according to the second best order also can reduce the required transistors.

According to FIG. 6B and FIG. 6C, the circuits of the best order and the second best order differ in receiving orders for the bits D0-D2 and the reference voltages Vr0-Vr8, and differ in connections of the second switches 628, 638. Specifically, first input ends 622 receive the bits D0-D2 according to a semi-reverse order (D1→D2→D0), second input ends 624 receive the reference voltages Vr0-Vr7 according to the second best order (Vr0→Vr2→Vr4→Vr6→Vr1→Vr3→Vr5→Vr7), and the second switches 628_1-628_3 of the first and second stages are specially connected. Other than the different parts, the remaining part of the second best order circuit is identical to the best order circuit, which can be referred to the digital-to analog converter 410 in the above and is not further narrated herein.

As mentioned before, the second best order is the result of performing N−2 reorder processes on the original order, and the N−2 reorder processes are identical to those for acquiring the best order. For example, the (N−2)th reorder process includes the following steps:

(1) dividing the (N−3)th sequence into $2^{N-3}$ sub-sequences seq(N−3)1−seq(N−3)$2^{N-3}$;
(2) acquiring odd components of K (K=1-$2^{N-3}$) sub-sequences seq(N−3)1−seq(N−3)$2^{N-3}$ to form a (2K−1)/$2^{N-2}$ part of a (N−2)th sequence; and
(3) acquiring even components of K (K=1-$2^{N-3}$) sub-sequences seq(N−3)1−seq(N−3)$2^{N-3}$ to form a 2K/$2^{N-2}$ part of the (N−2)th sequence.

Furthermore, the semi-reverse order is formed by the following steps:
(1) reversing a bit order of the digital signal DIG1 to be the semi-reverse order, i.e. D0→D1→D2;
(2) determining a second highest bit D1 of the bit order to be a lowest bit of the semi-reverse order; and
(3) determining a highest bit D2 of the bit order to be a second lowest bit of the semi-reverse order.

For example, the semi-reverse order is D1→D2→D0 in the embodiment of FIG. 6B.

Finally, the first second switch 628_1 selects the ($2^{(N-1)}$-1=3)th reference voltage Vr2 numbered by the original order or the ($2^{(N-1)}$+1=5)th reference voltage Vr4 numbered by the original order according to the (N=3)th bit D2. The second second switch 628_2 selects the ($2^N$-1=7)th reference voltage Vr6 numbered by the original order or the ($2^N$+1=9)th reference voltage Vr8 numbered by the original order according to the (N=3)th bit D2. The third second switch 628_3 selects the second selection result of the first second switch 628_1 or the second selection result of the second second switch 628_2 according to the (N−1=2)th bit D1.

Therefore, regardless of the digital-to analog converters 410, 630 applying the best order or the digital-to analog converter 620 applying the second best order, node voltages within the generation process of the first analog signal VH are further utilized for generating the second analog signal VL since the first analog signal VH and the second analog signal VL are two adjacent reference voltages, so as to reduce employed transistors.

To sum up, the present invention shares switches based on the relation between the output analog signals to employ fewer transistors for the digital-to-analog converter, so as to minimize circuit layout area and parasitic resistance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter for converting a digital signal into a first analog signal and a second analog signal, the digital signal comprising N bits, N being a positive integer, the digital-to-analog converter comprising:
a plurality of first input ends, each for receiving one of the N bits;
a plurality second input ends, for receiving a plurality of reference voltages arranged in a best order, wherein the plurality of reference voltages ordered by magnitude determines an original order, wherein the original order is performed with (N−1) reorder processes to determine the best order;
a plurality of first switches, electrically coupled to each other in a tree structure and electrically coupled to the plurality first input ends and the plurality second input ends, comprising N stages, each for selecting one of the plurality reference voltages according to one of the N bits to generate a first selection result;
at least N second switches, coupled in series, each for selecting a second selection result of a previous second switch of the second switch or the first selection result of one of the plurality of first switches according to one of the N bits, to generate the second selection result;
wherein the first selection result generated by the first switch of the Nth stage is the first analog signal, and the second selection result generated by the last one of the at least N second switches is the second analog signal;
wherein the Nth second switch is utilized for receiving the first selection result generated by the second first switch of the (N−1)th stage.

2. The digital-to-analog converter of claim 1, wherein:
a first one of the (N−1) reorder processes comprises acquiring odd components of a sequence to form a first half part of a first sequence, and acquiring even components of the sequence to form a second half part of the first sequence; and
each of a second one to the (N−1)th one of the (N−1) reorder processes comprises:
dividing an (n−1)th sequence into $2^{n-1}$ sub-sequences;
acquiring odd components of a kth sub-sequence of the $2^{n-1}$ sub-sequences to form a $(2K-1)/2^n$ part of an nth sequence; and
acquiring even components of the kth sub-sequence of the $2^{n-1}$ sub-sequences to form a $2K/2^n$ part of the nth sequence;
wherein n=2, 3, . . . or (N−1), and K=1, 2, . . . or $2^{n-1}$.

3. The digital-to-analog converter of claim 1, wherein the N stages correspond to the N bits according to a reverse order.

4. The digital-to-analog converter of claim 3, wherein the at least N second switches correspond to the N bits according to the reverse order.

5. The digital-to-analog converter of claim 3, wherein the reverse order is a reversed bit order of the digital signal.

6. The digital-to-analog converter of claim 1, wherein a most front second switch of the at least N second switches is utilized for selecting a $(2^{(N-1)}+1)$th one or a $(2^N+1)$th one of the plurality of reference voltages arranged by the original order according to the Nth bit.

7. The digital-to-analog converter of claim 1, wherein the plurality of first switches and the at least N second switches are transistor switches.

8. A digital-to-analog converter for converting a digital signal into a first analog signal and a second analog signal, the digital signal comprising N bits, N being a positive integer, the digital-to-analog converter comprising:
a plurality of first input ends, each for receiving one of the N bits;
a plurality second input ends, for receiving a plurality of reference voltages arranged in a second best order, wherein the plurality of reference voltages ordered by magnitude determines an original order, wherein the original order is performed with (N−2) reorder processes to determine the second best order;
a plurality of first switches, electrically coupled to each other in a tree structure and electrically coupled to the plurality first input ends and the plurality second input ends, comprising N stages, each for selecting one of the plurality reference voltages according to one of the N bits to generate a first selection result;
at least (N+1) second switches, coupled in series, each for selecting a second selection result of a previous second switch of the second switch or the first selection result of one of the plurality of first switches according to one of the N bits, to generate the second selection result;
wherein the first selection result generated by the first switch of the Nth stage is the first analog signal, and the second selection result generated by the last one of the at least (N+1) second switches is the second analog signal;
wherein the Nth second switch is utilized for receiving the first selection result generated by the second first switch of the (N−1)th stage.

9. The digital-to-analog converter of claim 8, wherein:
a first one of the (N−1) reorder processes comprises acquiring odd components of a sequence to form a first half part of a first sequence, and acquiring even components of the sequence to form a second half part of the first sequence; and
each of a second one to the (N−1)th one of the (N−1) reorder processes comprises:
dividing an (n−1)th sequence into $2^{n-1}$ sub-sequences;
acquiring odd components of a kth sub-sequence of the $2^{n-1}$ sub-sequences to form a $(2K-1)/2^n$ part of an nth sequence; and
acquiring even components of the kth sub-sequence of the $2^{n-1}$ sub-sequences to form a $2K/2^n$ part of the nth sequence;
wherein n=2, 3, . . . or (N−2), and K=1, 2, . . . or $2^{n-1}$.

10. The digital-to-analog converter of claim 8, wherein the N stages correspond to the N bits according to a semi-reverse order.

11. The digital-to-analog converter of claim 10, wherein the semi-reverse order is formed by:
reversing a bit order of the digital signal to be the semi-reverse order;
determining a second highest bit of the bit order to be a lowest bit of the semi-reverse order; and
determining a highest bit of the bit order to be a second lowest bit of the semi-reverse order.

12. The digital-to-analog converter of claim 8, wherein the at least (N+1) second switches correspond to the N bits according to a reverse order;
wherein the first two second switches correspond to a last bit of the N bits.

13. The digital-to-analog converter of claim 12, wherein the reverse order is a reversed bit order of the digital signal.

14. The digital-to-analog converter of claim 8, wherein:
a first one of the at least (N+1)second switches is utilized for selecting a $(2^{(N-1)}-1)$th one or a $(2^{(N-1)}+1)$th one of the plurality of reference voltages ordered by the original order according to an Nth one of the N bits;
a second one of the at least (N+1) second switches is utilized for selecting a $(2^N-1)$th one or a $(2^N+1)$th one of the plurality of reference voltages ordered by the original order according to the Nth one of the N bits; and
a third one of the at least (N+1)second switches is utilized for selecting the second selection result of the first second switch or the second selection result of the second second switch according to an (N−1)th one of the N bits.

15. The digital-to-analog converter of claim 8, wherein the plurality of first switches and the at least (N+1) second switches are transistor switches.

16. A source driving circuit, comprising:
a Gamma circuit, for providing a plurality of reference voltages between a high voltage and a low voltage;
a digital-to-analog converter, electrically coupled to the Gamma circuit, for selecting two from the plurality of reference voltages according to a digital signal comprising N bits to be a first analog signal and a second analog signal; and an interpolation circuit, electrically coupled to the digital-to-analog converter, for providing an interpolation voltage of the first analog signal and second analog signal according to a second digital signal to be a source driving signal;

wherein the digital-to-analog converter comprises:
  a plurality of first input ends, each for receiving one of the N bits;
  a plurality second input ends, for receiving the plurality of reference voltages arranged in a best order, wherein the plurality of reference voltages ordered by magnitude determines an original order, wherein the original order is performed with (N−1) reorder processes to determine the best order;
  a plurality of first switches, electrically coupled to each other in a tree structure and electrically coupled to the plurality first input ends and the plurality second input ends, comprising N stages, each for selecting one of the plurality reference voltages according to one of the N bits to generate a first selection result;
  at least N second switches, coupled in series, each for selecting a second selection result of a previous second switch of the second switch or the first selection result of one of the plurality of first switches according to one of the N bits, to generate the second selection result;

wherein the first selection result generated by the first switch of the Nth stage is the first analog signal, and the second selection result generated by the last one of the at least N second switches is the second analog signal;

wherein the Nth second switch is utilized for receiving the first selection result generated by the second first switch of the (N−1)th stage.

17. A source driving circuit, comprising:
  a Gamma circuit, for providing a plurality of reference voltages between a high voltage and a low voltage;
  a digital-to-analog converter, electrically coupled to the Gamma circuit, for selecting two from the plurality of reference voltages according to a digital signal comprising N bits to be a first analog signal and a second analog signal; and
  an interpolation circuit, electrically coupled to the digital-to-analog converter, for providing an interpolation voltage of the first analog signal and second analog signal according to a second digital signal to be a source driving signal;

wherein the digital-to-analog converter comprises:
  a plurality of first input ends, each for receiving one of the N bits;
  a plurality second input ends, for receiving the plurality of reference voltages arranged in a second best order, wherein the plurality of reference voltages ordered by magnitude determines an original order, wherein the original order is performed with (N−2) reorder processes to determine the second best order;
  a plurality of first switches, electrically coupled to each other in a tree structure and electrically coupled to the plurality first input ends and the plurality second input ends, comprising N stages, each for selecting one of the plurality reference voltages according to one of the N bits to generate a first selection result;
  at least (N+1) second switches, coupled in series, each for selecting a second selection result of a previous second switch of the second switch or the first selection result of one of the plurality of first switches according to one of the N bits, to generate the second selection result;

wherein the first selection result generated by the first switch of the Nth stage is the first analog signal, and the second selection result generated by the last one of the at least (N+1) second switches is the second analog signal;

wherein the Nth second switch is utilized for receiving the first selection result generated by the second first switch of the (N−1)th stage.

* * * * *